(12) United States Patent
Ker et al.

(10) Patent No.: US 7,129,546 B2
(45) Date of Patent: Oct. 31, 2006

(54) ELECTROSTATIC DISCHARGE PROTECTION DEVICE

(75) Inventors: Ming-Dou Ker, Hsinchu (TW); Kun-Hsien Lin, Pingtung County (TW); Geeng-Lih Lin, Hsinchu Hsien (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 10/992,362

(22) Filed: Nov. 19, 2004

(65) Prior Publication Data

US 2005/0133871 A1 Jun. 23, 2005

(30) Foreign Application Priority Data

Dec. 22, 2003 (TW) ............................... 92136356 A (51) Int. Cl.
   *H01L 23/62* (2006.01)
(52) U.S. Cl. .................. 257/360; 257/339; 257/357; 257/401
(58) Field of Classification Search ................ 257/355, 257/357, 365, 401, 360
   See application file for complete search history.

(56) References Cited

U.S. PATENT DOCUMENTS

| 5,742,083 | A | * | 4/1998 | Lin | ............................ 257/355 |
| 5,763,919 | A | * | 6/1998 | Lin | ............................ 257/360 |
| 5,882,967 | A | * | 3/1999 | Brown et al. | ............... 438/237 |
| 5,910,677 | A | * | 6/1999 | Irino | .......................... 257/393 |
| 6,258,672 | B1 | | 7/2001 | Shih et al. | |
| 6,291,862 | B1 | * | 9/2001 | Chevallier | .................. 257/392 |
| 6,424,013 | B1 | * | 7/2002 | Steinhoff et al. | ........... 257/355 |
| 6,552,399 | B1 | * | 4/2003 | Jun et al. | ..................... 257/357 |
| 6,576,934 | B1 | * | 6/2003 | Cheng et al. | ............... 257/107 |
| 6,653,709 | B1 | * | 11/2003 | Wu et al. | .................... 257/499 |
| 6,661,060 | B1 | * | 12/2003 | Lee et al. | .................... 257/355 |
| 6,759,691 | B1 | * | 7/2004 | Chen | .......................... 257/107 |
| 6,825,504 | B1 | * | 11/2004 | Ishizuka et al. | ............ 257/173 |
| 6,936,896 | B1 | * | 8/2005 | Ida et al. | .................... 257/361 |

* cited by examiner

*Primary Examiner*—Jerome Jackson
(74) *Attorney, Agent, or Firm*—Birch, Stewart, Kolasch & Birch, LLP (57) ABSTRACT

An ESD protection device. The ESD protection device has a substrate; a channel region, a source region, and a drain region. The channel region is formed on a predetermined area of a surface of the substrate, the channel region has a first side and a second side. The source region is formed adjacent to the first side. The drain region which has a heavily doped region and a lightly doped region formed below the heavily doped region is formed adjacent to the second side. The width along a longitudinal axis of the heavily doped region has variable length and thus the length between one side of the heavily doped region to the second side has variable length.

30 Claims, 7 Drawing Sheets

ELECTROSTATIC DISCHARGE PROTECTION DEVICE

BACKGROUND

The present invention relates to an electrostatic discharge (ESD) protection device, and more particularly, to an ESD structure with high ESD robustness in high-voltage CMOS process.

In CMOS integrated circuits (IC) technology, damage due to ESD events is a critical issue. Advanced technologies such as thin gate oxidation, short channel length, shallow junction, salicidation, etc., result in ICs having lower ESD endurance. According to the current industrial standard, the input and output pins of IC products must sustain the ESD stress of over 2000 V in human-body-model (HBM) and over 200 V in machine-model (MM) ESD stresses. Therefore, the ESD protection circuit must be disposed around the input and output (I/O) pads of an IC to provide ESD stress protection.

Figure 1A:
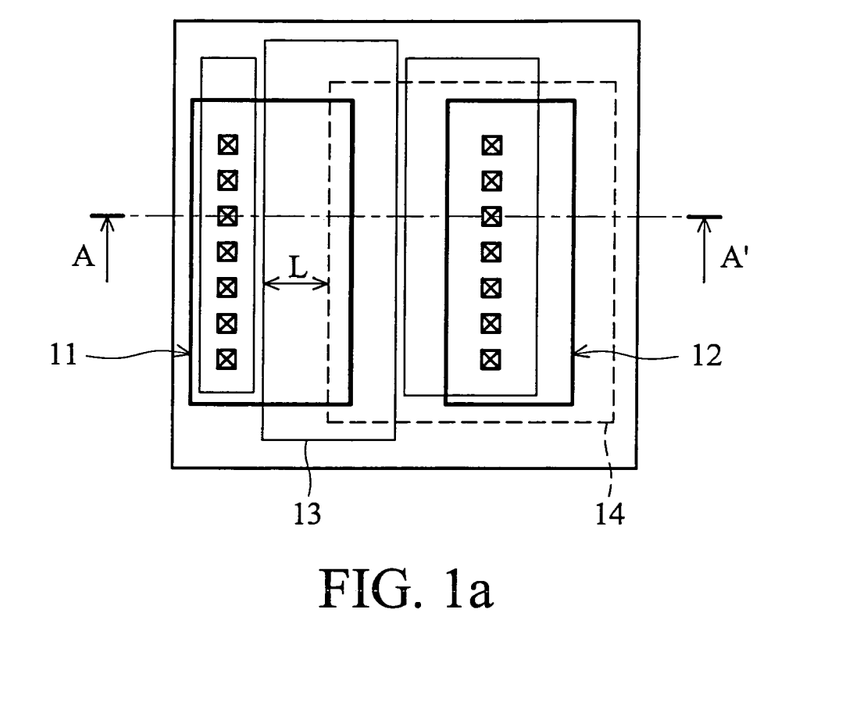
FIG. 1a is a top view diagram of a related high voltage ESD protection device.
Figure 1B:
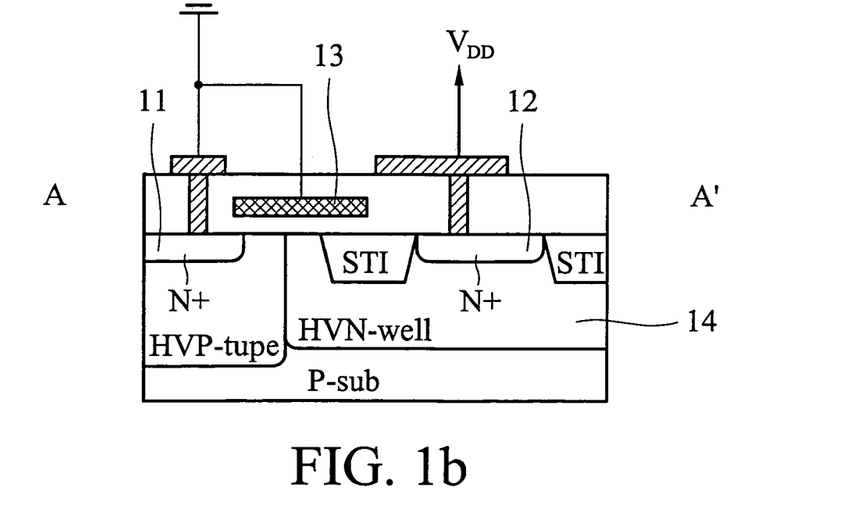

Increasing numbers of automotive and consumer products such as print head drivers, are used in high voltage areas. The typical layout and cross-section views with ESD protection device utilized in high voltage is shown in FIGS. 1a and 1b. The N type heavily doped source region 11 and the gate terminal 13 of the NMOS 1 are coupled to a ground (GND) and a n-well 14 is formed below the N type heavily doped drain region 12 to serve as a buffer layer. When an ESD event occurs, high current flows through the parasitic lateral BJT of the NMOS 1 to the ground protecting internal circuit. Most of the ESD current however flows through a corner of the N type heavily doped drain region 12 due to the tip discharge theorem. Thus most of the current accumulates at the corner and the interface at the corner of the N type heavily doped drain region 12 generally breaks down, resulting in a non-uniform current flow problem.

In U.S. Pat. No. 6,258,672; Shih, et al. describes another ESD protection device, in which the gate electrode has a variable width and thus the channel region has a variable length. The previously described problem, however still exists.

SUMMARY

Embodiments of the invention provide an ESD protection device, comprising a substrate, a channel region, a source region, and a drain region. The channel region is formed on a predetermined area of a surface of the substrate. The channel region has a first side and a second side. The source region is formed adjacent to the first side. The drain region, which has a heavily doped region and a lightly doped region formed there under, is formed adjacent to the second side. The width along a longitudinal axis of the heavily doped region has variable length and thus the length between one side of the heavily doped region and the second side has variable length.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein:

FIG. 1b is a cross section diagram along A–A' line of FIG. 1a;

FIG. 2b is a cross section diagram of the ESD protection device along B–B' line of FIG. 2a;

FIG. 2C is a cross section diagram of the ESD protection device along C–C' line of FIG. 2a;

FIG. 8b is a cross section diagram along B–B' line of FIG. 8a;

DETAILED DESCRIPTION OF THE INVENTION

First Embodiment

Figure 2A:
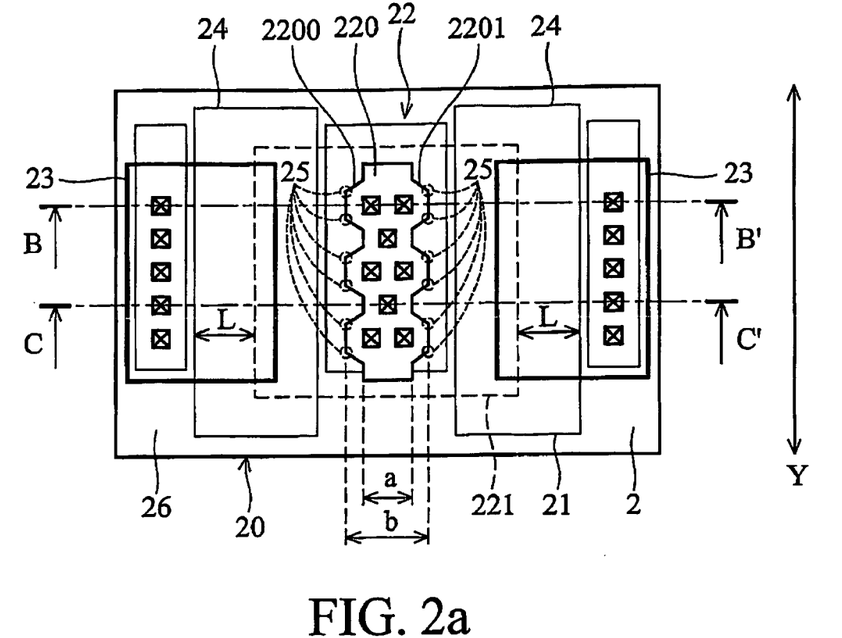
FIG. 2a is a top view diagram of the ESD protection device according to a first embodiment of the invention.
Figure 2B:
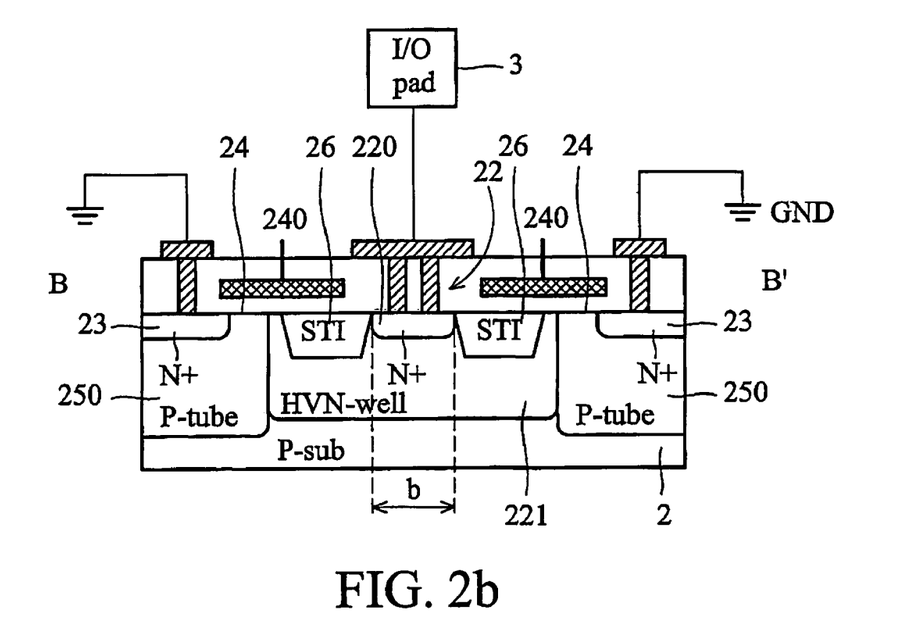
Figure 2C:
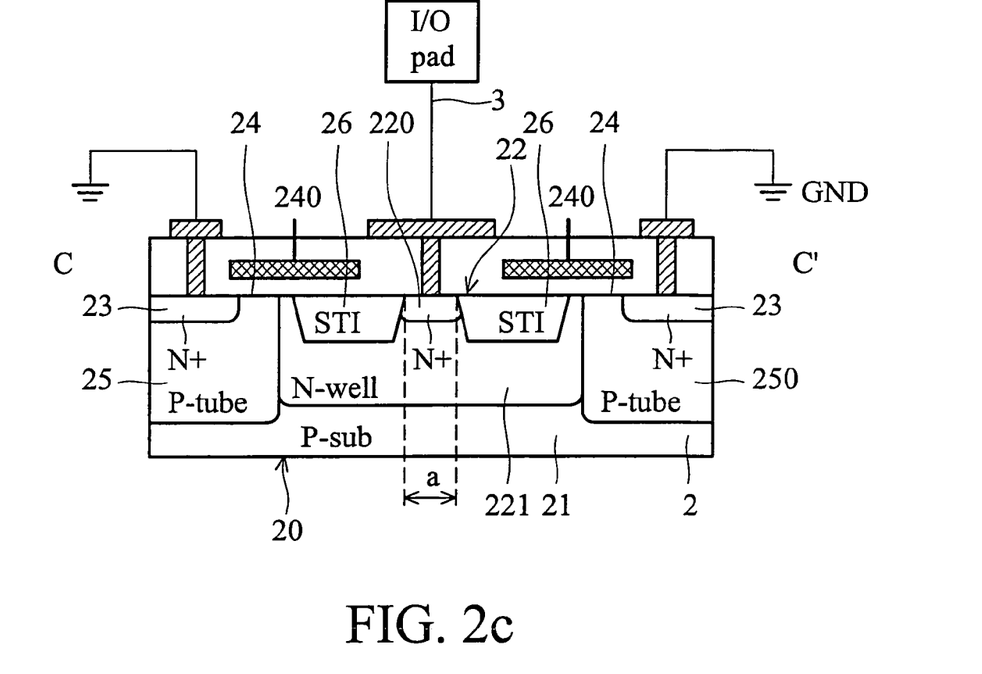

FIG. 2a is a top view diagram of the ESD protection device according to a first embodiment of the invention. FIG. 2b is a cross section diagram of the ESD protection device along B–B' line of FIG. 2a. FIG. 2C is a cross-section of the ESD protection device along line C–C' of FIG. 2a. The ESD protection device 2 is a NMOS transistor 20 according to the first embodiment. The NMOS transistor 20 which is a finger type MOS transistor has a p type substrate 2, a drain region 22, two source regions 23, and two channel regions 24. Each source region 23 is formed adjacent to the left or right side of the drain region 22. Each channel region 24 is formed between the drain region 22 and the corresponding source region 23.

The drain region 22 coupled to an I/O pad 3 is an N-type doped region. The drain region 22 which is a common drain region has a heavily doped region 220 and a lightly doped well region 221 formed below the heavily doped region 220. The width along a longitudinal axis Y of the heavily doped region 220 has a length varying between a first width a and a second width b. Thus the length between one side adjacent to the heavily doped region to a corresponding side of the source regions 23 has variable length. In FIG. 2a, a plurality of protruding trapeziums are formed on a lateral side 2200 and another lateral side 2201 of the heavily doped region 220, thus increasing the number of discharge corners 25. The heavily doped region 220 is surrounded by a shallow trench isolation layer 26. The two source regions 23 coupled to the ground (GND) are N-type regions. A p-type doped region 250 called a p-tube is formed below each of the source regions 23. A gate structure 240 is formed on each of the channel regions 24. Each of the gate structures 240 is formed on the surface of the substrate 2 between the source region 23 and the drain region 22. Every gate structure 240 is coupled to a power line or controlled by a pre-driver circuit (Not shown).

Second Embodiment

Figure 3:
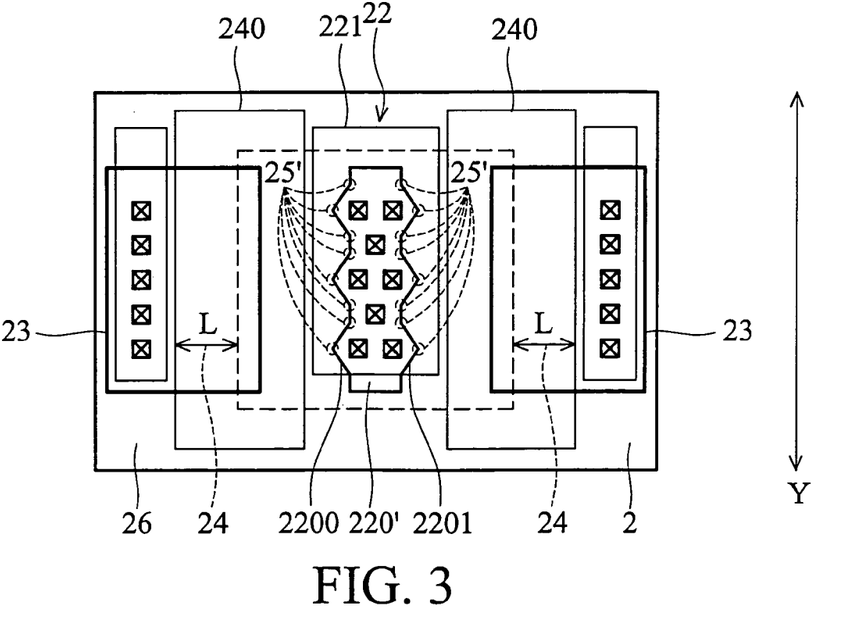
FIG. 3 is a top view diagram of the ESD protection device according to a second embodiment of the invention.

FIG. 3 is a top view diagram of the ESD protection device according to a second embodiment of the invention. The structure is substantially the same as the first embodiment, the main difference from the first embodiment is that a plurality of protruding triangles are formed on a lateral side 2200 and a lateral side 2201 of the heavily doped region 220', and the number of discharge corners 25' is increased.

Third Embodiment

Figure 4:
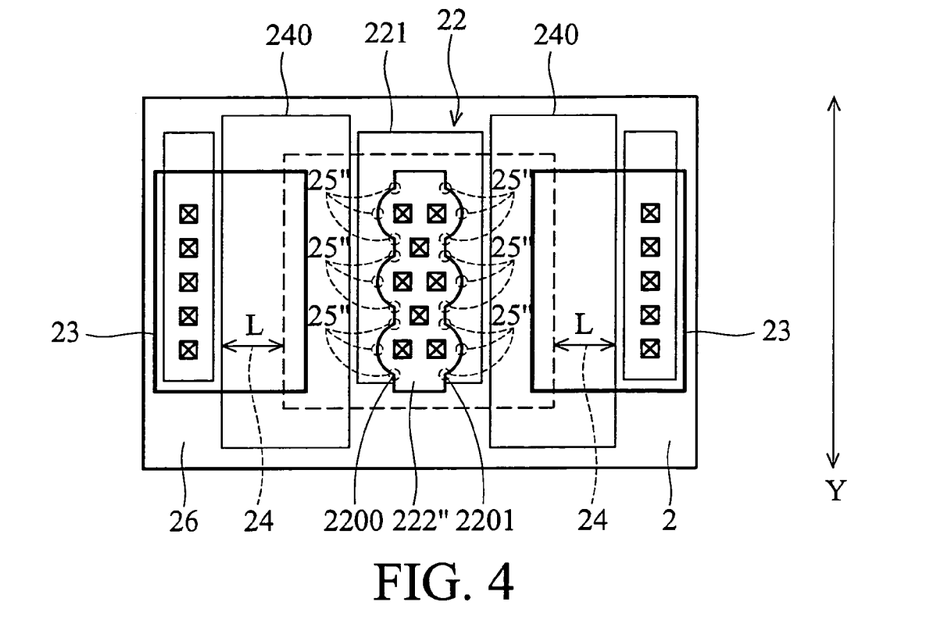
FIG. 4 is a top view diagram of the ESD protection device according to a third embodiment of the invention.

FIG. 4 is a top view diagram of the ESD protection device according to a third embodiment of the invention. The structure is substantially the same as the first embodiment, the main difference from the first embodiment is that a plurality of protruding arcs are formed on a lateral side 2200 and a lateral side 2201 of the heavily doped region 220", and the number of discharging corners 25" is increased.

Fourth Embodiment

Figure 5:
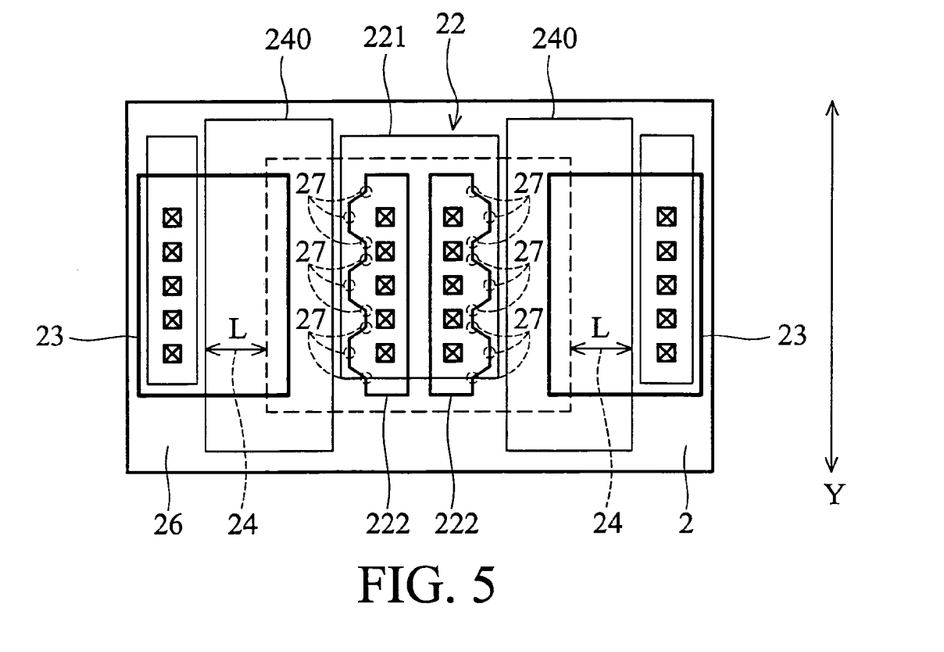
FIG. 5 is a top view diagram of the ESD protection device according to a fourth embodiment of the invention.

FIG. 5 is a top view diagram of the ESD protection device according to a fourth embodiment of the invention. The structure is substantially the same as the first embodiment, the main difference from the first embodiment is that two heavily doped regions 222 are formed in a drain region 22, and each of the heavily doped regions 222 has a plurality of protruding trapeziums, thus a plurality of discharge corners 27 are formed thereon.

Fifth Embodiment

Figure 6:
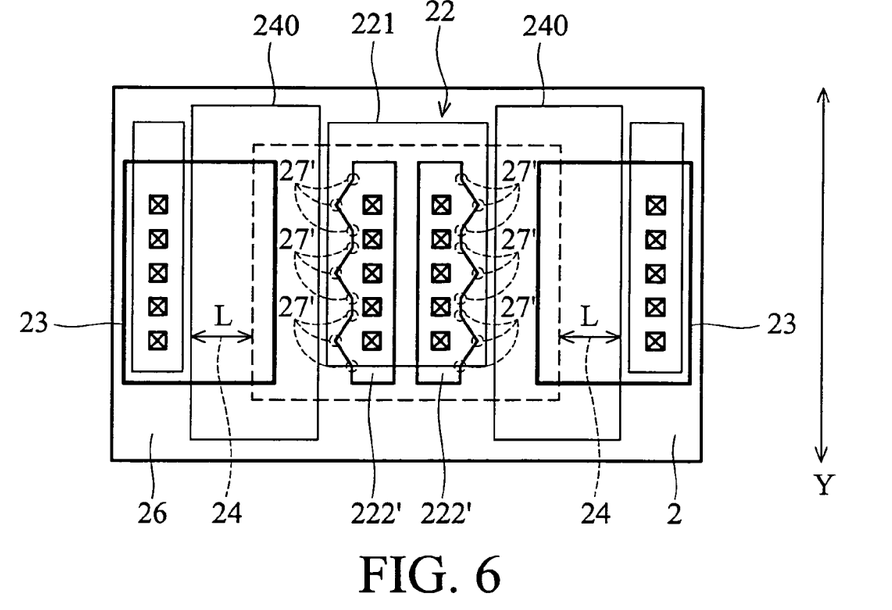
FIG. 6 is a top view diagram of the ESD protection device according to a fifth embodiment of the invention.

FIG. 6 is a top view diagram of the ESD protection device according to a fifth embodiment of the invention. The structure is substantially the same as the first embodiment, the main difference from the first embodiment is that two heavily doped regions 222' are formed in a drain region 22, and each of the heavily doped regions 222' has a plurality of protruding triangles, and a plurality of discharging corners 27' are formed thereon.

Sixth Embodiment

Figure 7:
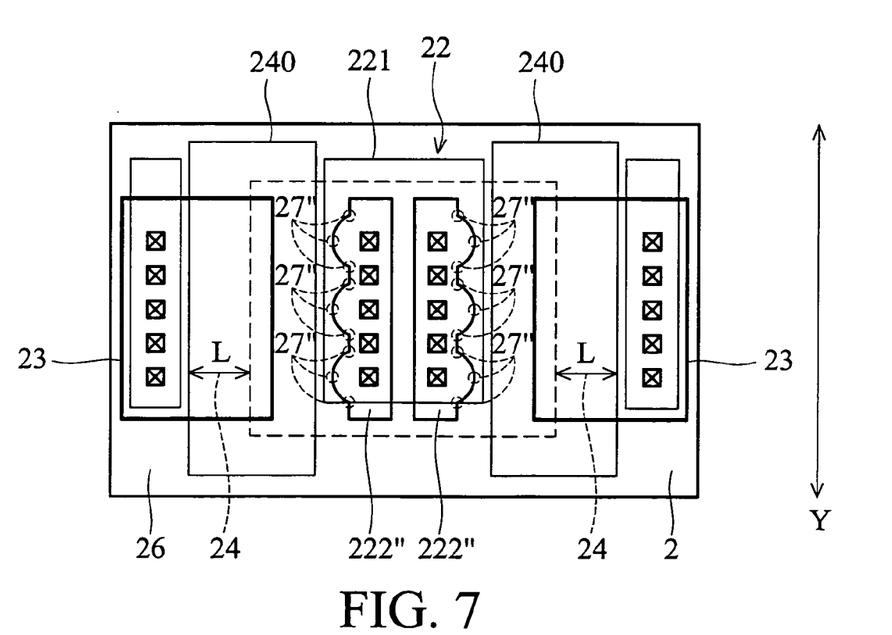
FIG. 7 is a top view diagram of the ESD protection device according to a sixth embodiment of the invention.

FIG. 7 is a top view diagram of the ESD protection device according to a sixth embodiment of the invention. The structure is substantially the same as the first embodiment, the main difference from the first embodiment is that two heavily doped regions 222" are formed in a drain region 22, and each of the heavily doped regions 222' has a plurality of protruding arcs, and plurality of discharging corners 27" are formed thereon.

Seventh Embodiment

Figure 8A:
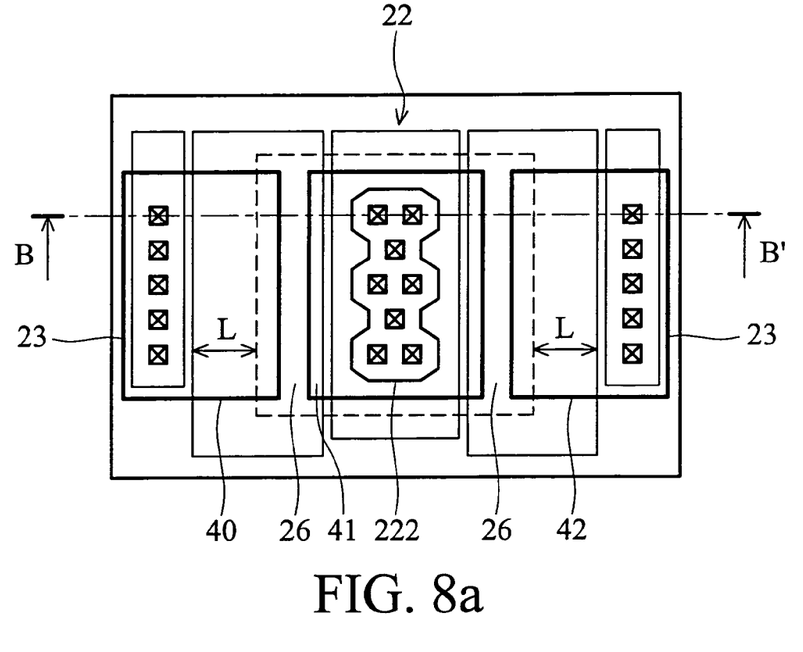
FIG. 8a is a top view diagram of the ESD protection device according to a seventh embodiment of the invention.
Figure 8B:
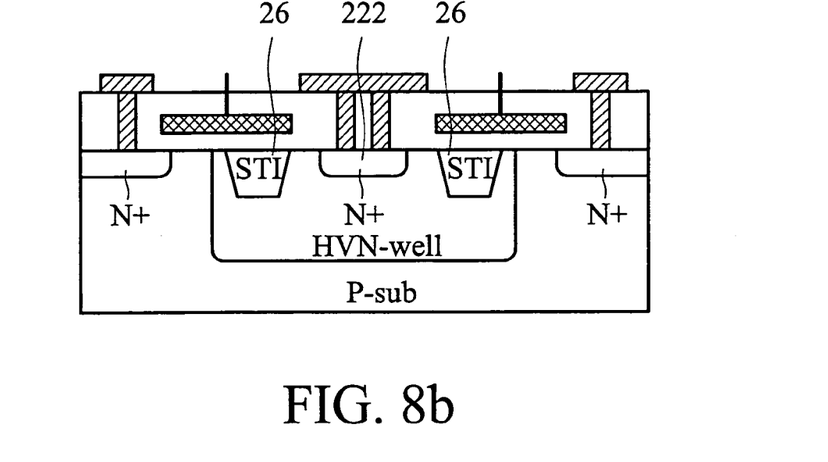

FIG. 8a is a top view diagram of the ESD protection device according to a seventh embodiment of the invention; FIG. 8b is a cross section along line B–B' of FIG. 8a. As shown in FIGS. 8a and 8b, active regions 40,41, and 42 are defined by an active mask (not shown) Next, source regions 23 are formed on the corresponding active regions 40 and 42, and heavily doped region 222 of the drain region 22 is formed on the active region 41. Two lateral sides of the heavily doped region 222 has a polarity of protruding trapeziums, protruding triangles or protruding arcs. In the described manufacture procedure, the isolation layer 26 and the heavily doped region 222 are not butted.

Figure 9:
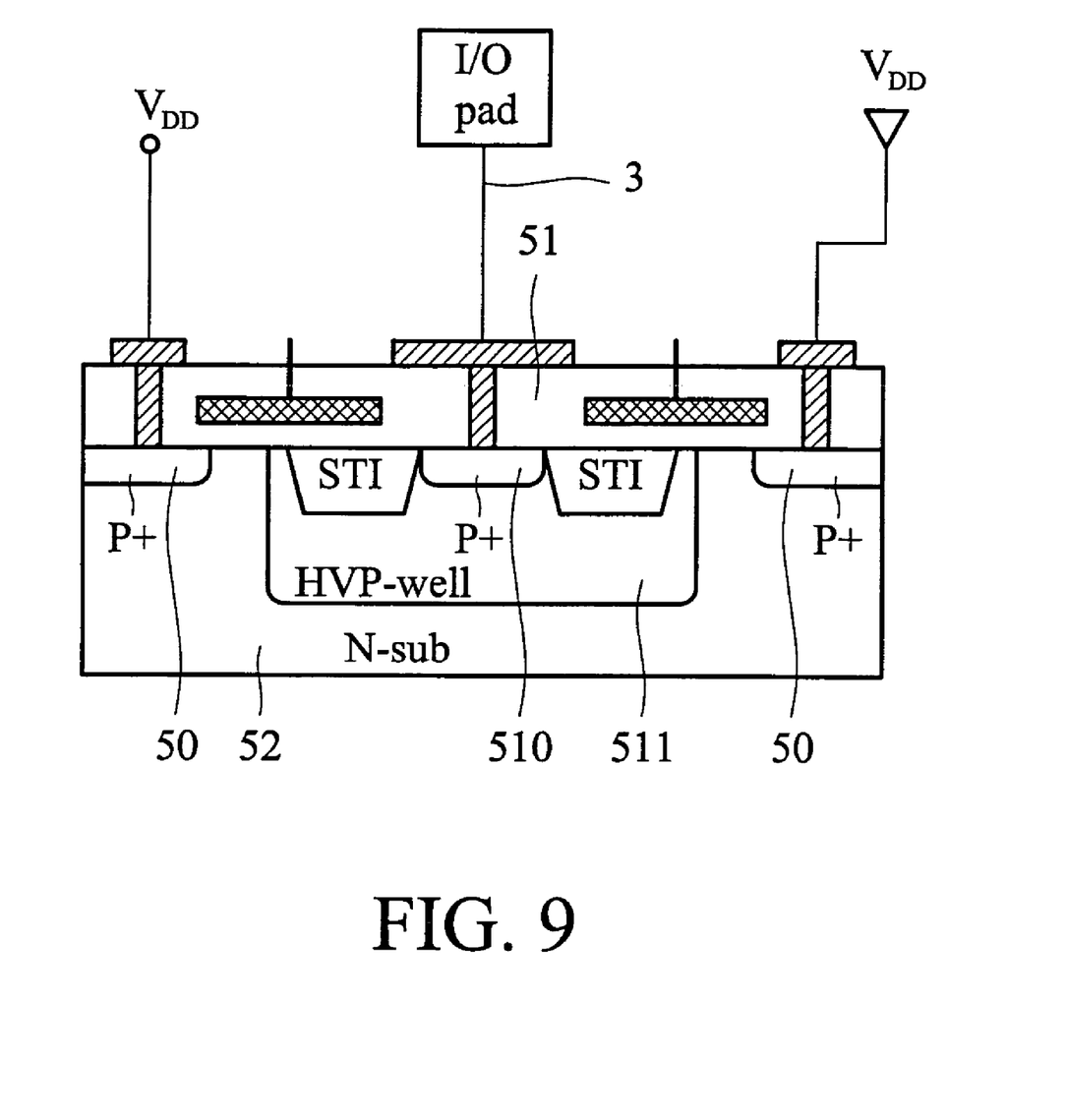
FIG. 9 is a cross section diagram of the ESD protection device according to an eighth embodiment of the invention.

The mentioned embodiments also can be formed by a PMOS transistor shown in FIG. 9. The source region 50 is a P-type doped region, the heavily doped region 510 and the lightly doped well region 511 are P-type doped regions, and the substrate 52 is an N type doped substrate. The source region 50 is connected to a high voltage source $V_{DD}$. The drain region 51 is connected to the I/O pad.

Increased discharge corners are formed at the side of the drain region and the discharge paths are distributed more uniformly by the variable length of the heavily dope region of the drain region, thus increasing ESD turn-on efficiency.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation to encompass all such modifications and similar arrangements.

What is claimed is:

1. An ESD protection device, comprising:
   a substrate;
   a channel region, formed on a predetermined region of a surface of the substrate, the channel region comprising a first side and a second side;
   a source region, formed adjacent to the first side; and
   a drain region, formed adjacent to the second side, the drain region comprising a heavily doped region and a lightly doped well region formed below the heavily doped region, wherein the width along a longitudinal axis of the heavily doped region has a variable length and the length between one side adjacent to the heavily doped region to the second side has variable length;
   wherein the lightly doped well region is adjacent to the channel region and the heavily doped region is inside the lightly doped well region.

2. The ESD protection device of claim 1, wherein the ESD device is an NMOS device, the source region is a N-type implant region, the heavily doped region and the lightly doped well region are N-type, the substrate is a p type substrate.

3. The ESD protection device of claim 2, wherein the source region is connected to a ground, the heavily doped region is connected to an I/O pad.

4. The ESD protection device of claim 1, wherein the ESD device is a PMOS device, the source region is a P-type region, the heavily doped region and the lightly doped well region are P-type, the substrate is an N type substrate.

5. The ESD protection device of claim 4, wherein the source region is connected to a high voltage source, the heavily doped region is connected to an I/O pad.

6. The ESD protection device of claim 1, further comprising an insulation layer formed between the heavily doped region and the channel region.

7. The ESD protection device of claim 6, wherein the heavily doped region is surrounded by the insulation layer, and the heavily doped region and the insulation layer are butted to each other.

8. The ESD protection device of claim 6, wherein the heavily doped region is surrounded by the insulation layer, and the heavily doped region and the insulation layer are not butted to each other.

9. The ESD protection device of claim 6, wherein the insulation layer is a shallow trench isolation layer.

10. The ESD protection device of claim 1, a plurality of protruding trapeziums are formed on a lateral side of the heavily doped region.

11. The ESD protection device of claim 1, a plurality of protruding triangles are formed on a lateral side of the heavily doped region.

12. The ESD protection device of claim 1, a plurality of protruding arcs are formed on a lateral side of the heavily doped region.

13. The ESD protection device of claim 1, the drain region is a common drain region of a finger type MOS transistor.

14. The ESD protection device of claim 1, a gate structure is formed on the channel region, and the gate structure is connected to a power Line or controlled by a pre-driver circuit.

15. A finger type ESD protection device, comprising:
a substrate;
two source regions, forming on a predetermined region of a surface of the substrate;
a drain region, formed between the two source regions, the drain region has a heavily doped region and a lightly doped well region formed below the heavily doped region; and
two channel regions, each channel region is formed between a corresponding source region and the drain region;
wherein the width along a longitudinal axis of the heavily doped region has a variable length and the length between one side of the heavily doped region to the second side has variable length;
wherein the lightly doped well region is adjacent to the channel regions and the heavily doped region is inside the lightly doped well region.

16. The finger type ESD protection device of claim 15, wherein the source regions are N-type regions, the heavily doped region and the lightly doped well region are N-type, the substrate is a p type substrate.

17. The finger type ESD protection device of claim 15, wherein the source regions are connected to a ground, the heavily doped region is connected to an I/O pad.

18. The finger type ESD protection device of claim 15, wherein the ESD device is a PMOS device, the source regions are P-type regions, the heavily doped region and the lightly doped well region are P-type, the substrate is a N-type substrate.

19. The finger type ESD protection device of claim 18, wherein the source regions are connected to a high voltage source, the heavily doped region is connected to an I/O pad.

20. The finger type ESD protection device of claim 15, further comprising an insulation layer forming between the heavily doped region and a corresponding channel region.

21. The finger type ESD protection device of claim 20, the heavily doped region is surrounded by the insulation layer, and the heavily doped region and the insulation layer are butted.

22. The finger type ESD protection device of claim 20, the heavily doped region is surrounded by the insulation layer, and the heavily doped region and the insulation layer are not butted to each other.

23. The finger type ESD protection device of claim 20, the insulation layer is a shallow trench isolation layer.

24. The finger type ESD protection device of claim 15, wherein the drain region has one heavily doped region, the heavily doped region has a first lateral side and a second lateral side, and a plurality of protruding trapeziums are formed on the lateral side of the heavily doped region.

25. The finger type ESD protection device of claim 15, wherein the drain region has one heavily doped region, the heavily doped region has a first lateral side and a second lateral side, and a plurality of protruding triangles are formed on the lateral side of the heavily doped region.

26. The finger type ESD protection device of claim 15, wherein the drain region has one heavily doped region, the heavily doped region has a first lateral side and a second lateral side, and a plurality of protruding arcs are formed on the lateral side of the heavily doped region.

27. The finger type ESD protection device of claim 15, wherein the drain region has two heavily doped regions, and a plurality of protruding trapeziums are formed on the lateral side adjacent to the channel region of each heavily doped region.

28. The finger type ESD protection device of claim 15, wherein the drain region has two heavily doped regions, and a plurality of protruding triangles are formed on the lateral side adjacent to the channel region of each heavily doped region.

29. The finger type ESD protection device of claim 15, wherein the drain region comprises two heavily doped regions, and a plurality of protruding arcs are formed on the lateral side adjacent to the channel region of each heavily doped region.

30. The finger type ESD protection device of claim 15, a gate structure is formed on each channel region, and the gate structure is coupled to a power Line or controlled by a pre-driver circuit.

* * * * *